United States Patent [19]

Moreau et al.

[11] Patent Number: 4,880,722
[45] Date of Patent: Nov. 14, 1989

[54] DIAZOQUINONE SENSITIZED POLYAMIC ACID BASED PHOTORESIST COMPOSITIONS HAVING REDUCED DISSOLUTION RATES IN ALKALINE DEVELOPERS

[75] Inventors: Wayne M. Moreau, Wappingers Falls; Kaolin N. Chiong, Pleasantville, both of N.Y.

[73] Assignee: International Business Machines Corporation, Armonk, N.Y.

[21] Appl. No.: 107,505

[22] Filed: Oct. 8, 1987

Related U.S. Application Data

[63] Continuation-in-part of Ser. No. 804,869, Dec. 5, 1985, abandoned.

[51] Int. Cl.$^4$ ................................................. G03C 1/60
[52] U.S. Cl. ..................................... 430/192; 430/189; 430/190; 430/191; 430/154; 430/326; 430/330
[58] Field of Search ................ 430/192, 191, 190, 189

[56] References Cited

U.S. PATENT DOCUMENTS

| | | |
|---|---|---|
| 3,533,796 | 10/1970 | Lassig et al. ........................ 430/192 |
| 3,551,154 | 12/1970 | Di Blas et al. ...................... 430/192 |
| 3,869,292 | 3/1975 | Peters ................................... 430/192 |
| 3,944,421 | 3/1976 | Lewis et al. ......................... 430/299 |
| 4,080,246 | 3/1978 | Bottisti et al. ....................... 430/192 |
| 4,093,461 | 6/1978 | Loprest et al. ...................... 430/192 |
| 4,196,003 | 4/1980 | Watanabe ............................. 430/192 |
| 4,242,437 | 12/1980 | Rohloff ................................. 430/270 |
| 4,331,705 | 5/1982 | Samudrala ........................... 430/270 |
| 4,339,521 | 7/1982 | Ahne et al. .......................... 430/192 |
| 4,369,090 | 1/1983 | Wilson et al. ........................ 430/317 |
| 4,397,937 | 8/1983 | Clecak et al. ....................... 430/192 |
| 4,411,981 | 10/1983 | Minezaki ............................. 430/299 |
| 4,439,516 | 3/1984 | Cernigliaro et al. ................ 430/192 |
| 4,451,551 | 5/1984 | Kataoka et al. ..................... 430/270 |
| 4,454,220 | 6/1984 | Goff ...................................... 430/311 |
| 4,524,121 | 6/1985 | Gleim et al. ......................... 430/192 |
| 4,745,045 | 5/1988 | Fredericks et al. ................. 430/192 |

OTHER PUBLICATIONS

De Forest, W. S., "Photoresist Materials and Processes", McGraw-Hill Book Co., 1975, pp. 147–149.

Primary Examiner—Charles L. Bowers, Jr.
Attorney, Agent, or Firm—Perman & Green

[57] ABSTRACT

The dissolution rate in alkaline developer solutions of image-wise exposed photoresist systems based on diazoquinone sensitized polyamic acid is reduced to prepare relief images of fine line resolution by reducing the acidity of the polyamic acid prior to exposure.

10 Claims, No Drawings

DIAZOQUINONE SENSITIZED POLYAMIC ACID BASED PHOTORESIST COMPOSITIONS HAVING REDUCED DISSOLUTION RATES IN ALKALINE DEVELOPERS

CROSS REFERENCE TO RELATED APPLICATIONS

This application is a continuation-in-part of U.S. Ser. No. 804,869 filed Dec. 5, 1985, abandoned.

BACKGROUND OF THE INVENTION

1. Field of the Invention

This invention relates to photoresists, and more particularly to light sensitive photoresists that are based on diazoquinone sensitized polyamic acid.

2. The Prior Art

Photoresist compositions are well known in the art and comprise coatings deposited from a solution which when exposed to light of proper wave length are chemically altered in their solubility to certain solvents (developers). Two types are known, namely negative and positive photoresists. The negative acting resist is initially a mixture which is soluble in its developer but following exposure to activating radiation becomes insoluble in the developer thereby defining a latent image. Positive acting resists work in the opposite fashion, activating radiation making the resist soluble in the developer.

Positive working resists are known to the art and generally comprise a light sensitive compound in a film-forming polymeric binder. The resin binder most frequently used are the alkali soluble phenolformaldehyde resins. These materials are the product of a reaction of a phenol and formaldehyde under conditions whereby a thermoplastic (novolak) polymer is formed. Positive resists are prepared using the novolak type phenol formaldehyde resin by incorporating therein a photoactive compound, a so-called sensitizer, for instance, one of the group of the 4- or 5-substituted diazonaphthoquinone (1,2)-diazide-sulfonic acid esters.

In the prior art, the above described positive resists using novolak resins as a binder are most often used as masks to protect substrates from chemical etchants in the manufacture of semiconductors. In such manufacture, the photoresist is coated onto the surface of a semiconductor substrate and then imaged and developed to remove soluble portions thereof. The resist medium remaining on the surface of the substrate is then employed as a protective mask to facilitate the selective etching of the exposed portions of the substrate thereby defining a circuit pattern.

Etching of the substrate may be conventionally carried out by chemical treatment or by dry etching, e.g. reactive ion etching with chemically active gaseous e.g. fluorocarbon species formed by glow discharge. Chemical etching has the disadvantage that the purity and composition of the etchant must be carefully regulated and the duration of the etching must be carefully controlled to prevent under or over etching of the thin film. Reactive ion etching is a practical alternative to chemical etching. When using reactive ion etching the control problems associated with chemical etching are avoided and the etching equipment assures adequate process control for the most precise thin film patterns.

One of the problems associated with reactive ion etching, is that many resist materials cannot withstand the process intact and are eroded along with the substrate or flow due to reaction with the gaseous ions and the temperature of the semiconductor substrate (typically about 200° C.) resulting in loss of pattern resolution. For example, novolak type phenol formaldehyde resins begin to flow at temperatures in excess of 120° C. and will erode when struck by the gas stream generated during reactive ion etching.

Photosensitized polyamic acids have been disclosed by the art for the formation of relief patterns on a support, e.g. U.S. Pat. No. 4,451,551, wherein a coating film containing polyamic acid photosensitized with a compound having an amino group and an aromatic azide group is spin coated on a support, image-wise exposed to a source of UV radiation after which the unexposed portions are dissolved and removed with developing solution to form a negative relief pattern. After development, the polymeric relief pattern is a precursor of a heat resistant polyimide, and is converted to a heat resistant imide polymer by heat treatment at 150°–300° C. The resultant relief pattern is resistant to distortion when heated to 400° C. for an hour and is disclosed as being useful as a dry-etching resistant photoresist.

Attempts have been made to prepare positive working polyamic acid based photoresist compositions using as the photosensitizer diazoquinone (1,2)-diazide-sulfonic acid esters. Such attempts have not been successful as the photoresist systems exhibit high dissolution rates for development in the alkaline solutions normally used as developers. The very high dissolution rates prevent adequate control over processes to obtain fine line configurations. Attempts to decrease the dissolution rate by increasing the concentration of the sensitizer in the photoresist, e.g. up to about 50% by weight, increases the optical density of the photoresist to the point where full penetration of the film thickness by a radiation source such as ultraviolet light is substantially unattainable.

There is, therefore, a need in the art for a system which will provide the control of the dissolution rate of diazoquinone sensitized polyamic acid based photoresists by alkaline developer solutions without reducing the sensitivity of the polyamic acid to ultraviolet light exposure so that excellent pattern delineation is obtained.

SUMMARY OF THE INVENTION

It has now been found that the dissolution rate of image exposed photoresist systems based on polyamic acid may be controlled during development to levels useful in the manufacture of resists by controlling the acidity of the polyamic acid component of the photoresist prior to image-wise exposure of the photoresist, i.e. reducing the acidity will reduce the dissolution rate and thereby increase the dissolution time.

By reducing the acidity of the polyamic acid by about 10 to about 40% of its original value, and preferably about 10 to about 30%, the dissolution rate of the image-wise exposed photoresist in alkaline developers may be controlled to provide a tailored development rate within a desired range due to the decreased dissolution rate of the polyamic acid of reduced acidity in the developer solutions.

Photoresists prepared from polyamic acids of reduced acidity exhibit excellent thermal stability, i.e. the images in the resist undergo little or no dimensional changes or distortion at temperatures in the order of 250° to 300° C. and undergo dry etching with reactive ion etching in fluorinated gases without substantive erosion of the resist profile.

DESCRIPTION OF THE PREFERRED EMBODIMENTS

The polyamic acids used in the preparation of the photoresist compositions of the present invention have the general formula

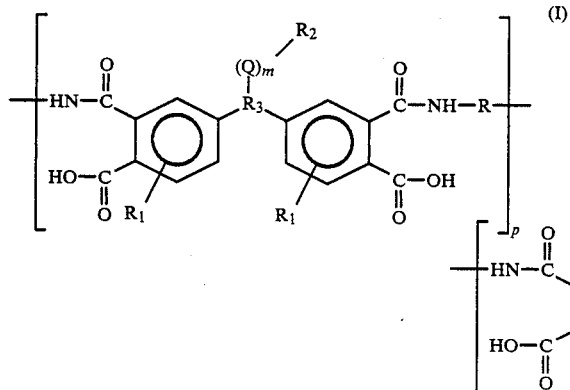

wherein Q is C or C=O, R is a divalent aromatic or aliphatic radical having no active hydrogen. The divalent radical R includes for example

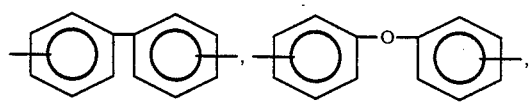

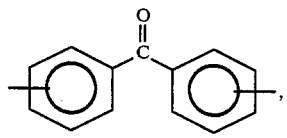

$-CH_2-$, $-CH_2-CH_2-$ $R_1$ is hydrogen or an alkyl group containing 1 to 3 carbon atoms.

$R_2$ and $R_3$ are independently selected from H, $CH_3$, $C_nH_{2n+1}$ where n is a positive integer and $CF_3$, m is an integer from 0 to 1 and p is a positive integer.

A polyamic acid represented by formula (I), or its functional derivative when heated at temperatures of 150°–300° C. is condensed and converted to a thermally stable polyimide having imide rings as represented by the formula

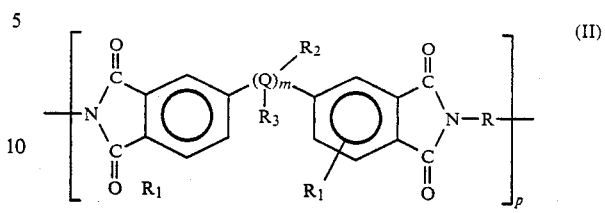

Polyamic acids useful in preparing the photoresist compositions of the present invention are available commercially. For example a polyamic acid having the formula

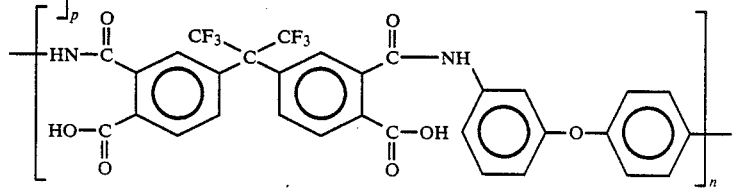

where n is a positive integer whereby the molecular weight of the polyamic acid is 20,000 is available from E. I. Dupont de Nemour Company under the designation PI 2566.

Other commercially available polyamic acids useful in the preparation of the photoresist compositions of the present invention include PI 2550 available from E. I. Dupont de Nemour Company having the formula

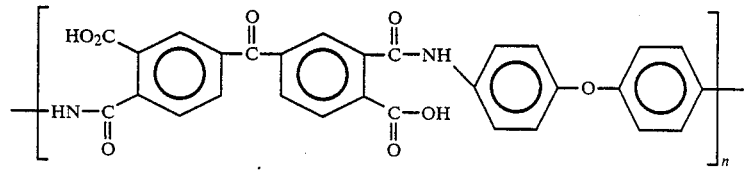

and PI 5878 having the formula

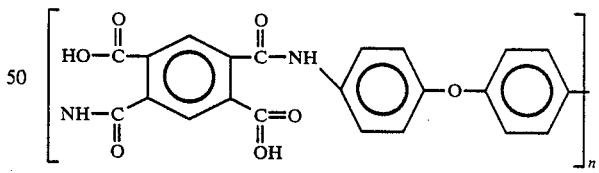

wherein n is a positive integer.

The acidity of the polyamic acid may be reduced to the desired amount, generally to about 10 to about 40 percent of the original acidity of the polyamic acid, by any of a variety of means including partial imidization, through chemical means, incorporation of a basic organic reagent in the photoresist composition, partial neutralization of the free carboxylic acid groups of the polyamic acid with organic bases, or the use of blends of the polyamic acid with its ester derivatives or with copolymers of the acid and its ester.

Partial imidization, preferably to a level of about 10 to about 30 percent of the polyamic acid may be accomplished for some polyamic acids during the coating process wherein the polyamic acid based photoresist solution is deposited on the semiconductor substrate. Thus, after the polyamic acid based photoresist solution is coated on the semiconductor substrate, the substrate is heated at a temperature of about 85°–95° C. for about 15 to about 30 minutes to effect about 10 to about 20% imidization of the polyamic acid. Although at higher temperature a higher percentage imidization of the polyamic acid may occur, (e.g. at 120° C. 35% imidization occurs) temperatures greater than 100° C. are to be avoided as such temperatures will cause degradation of the diazoquinone sensitizer which is also dissolved in the photoresist solution. Heating to cause reduction of acidity and a higher percentage imidization has been found to be effective for only certain polyamic acids. For instance, as shown by example below, it works for PI 2566 but it does not for PI 5878. For any particular polyamic acid the reduction of acidity from heating, if any, may be determined by infrared absorption at 1710 cm$^{-1}$ and 1770 cm$^{-1}$. Alternatively, the extent of reduction of acidity may be ascertained by observing the dissolution rate or time for a photoresist composition prepared from the polyamic acid, i.e. if a reduction in acidity has occurred, the dissolution rate will be decreased and the dissolution time will be increased from for instance about 10–20 seconds to about 60–150 seconds or more. If partial imidization does not occur merely by heating for a particular polyamic acid, then chemical means will accomplish it.

Acidity reduction of the polyamic acid by the use of alkaline reagents may be accomplished by dissolving organic alkaline compounds such as imidazole, and triethylamine in the photoresist solution at a concentration of about 1 to about 10 percent by weight based on the weight of the polyamic acid dissolved in the solution. This will result in the formation of a carboxylate amine salt which facilitates imidization at low temperatures.

Partial neutralization of the free carboxylic acid groups of the polyamic acid may be accomplished by reacting one equivalent of a basic organic compound such as an amine compound such as triethylamine to one equivalent of the polyamic acid before incorporation of the polyamic acid in the photoresist solution. Alternatively partial esterification of the free carboxylic acid groups may be accomplished by reacting RCOCL or RCOR', where R and R' are organic moieties, with the polyamic acid. In either case, the amount of reagents to be used must be determined by routine experimentation and will depend upon the specific dissolution rate or dissolution time which is desired in the manufacturing process. Generally, excess reagents are removed by low temperature vacuum distillation. These methods will generally allow up to about 25% imidization before gel formation occurs.

Acidity reduction of the polyamic acid component of the photoresist composition may also be achieved by replacing a portion of a polyamic acid with an ester derivative of the polyamic acid or with a copolymer of the polyamic acid and an ester derivative. In this case the photoresist solution will have a polyamic acid solids content comprised of about a 5:1 to 3:7 ratio of polyamic acid to its ester or copolymer derivative, depending upon the specific polyamic acid and dissolution rate desired. To prepare a photoresist solution for coating semiconductor substrates, the polyamic acid of reduced acidity is dissolved in a solvent for the polyamic acid at an appropriate solids concentration. Generally, this will be about 10 to about 20 percent by weight and preferably about 14 to about 18 percent by weight. Suitable solvents include polar solvents such as N-methyl-2-pyrrolidone, N-acetyl-2-pyrrolidone, N, N'-dimethylacetamide, dimethylsulfoxide and dimethylimidazolidinone. These may be used alone or as mixtures thereof.

As the diazoquinone photosensitizer, there may be used diazoquinone compounds such as 2,3,4-tri[(6-diazo-5,6-dihydro-5-oxo-napthalenyl) sulfonyl-oxy]-benzophenone; 4,8 bis [(6-diazo-5,6-dihydro-5-oxo-1-naphthalenyl) sulfonyl-oxy methyl]tricyclo [5.2.1.0$^{2,6}$]decane; diazonapthoquinone; and those of the 1,2-diazonaphthoquinone-5-sulfonate type, such as 1-oxo-2-diazo-napthalene-5-sulfonic acid ester of 2,3,4-trihydroxybenzophenone as disclosed in U.S. Pat. Nos. 3,046,118; 3,046,121; 3,106,465; 3,201,239; and 3,666,473.

The amount of diazoquinone photosensitizer used in conjunction with the polyamic acid of reduced acidity will depend on the specific formulation and will be determined by routine experimentation. Generally the photosensitizer will be used in a concentration of from about 5 to about 25 percent by weight of the polyamic acid of reduced acidity. If the amount of diazoquinone sensitizer incorporated in the photoresist solutions of the present invention are substantially in excess of 25%, the dissolution rate of the exposed photoresist composition in alkaline developer solutions may be too rapid to prepare resist images of fine line resolution.

In operation to form a resist mask, a thin film of the photosensitized polyamic acid of reduced acidity is solution cast or spun onto a desired semiconductor substrate for use as a photoresist. The photoresist is deposited on the substrate as a film of about 1 to 3 um in thickness. In the event partial imidization is the route chosen to effect acidity reduction of the polyamic acid, the deposited film is heated at about 85°–95° C. for about 30 to about 60 minutes. Otherwise the cast film is heated at 85 to 95° C. for 30 minutes to effect evaporation of the solvent.

The dried photoresist film is then exposed to radiation which will cause the diazoquinone sensitizer to react. Conventionally, actinic light is used at a wavelength of 365 to 436 nanometers as well as various forms of high energy radiation such as x-ray, ion beam and electron beam. The exposure takes place either through a pattern mask or by directing a shaped beam of radiation across the surface of the photosensitive resist layer. A pattern is developed in the photoresist layer to expose portions of the substrate by subjecting the layer to an alkaline developer solution which removes the exposed areas of the resist to prepare a positive photoresist. The irradiated photoresist film is developed by immersing, the coated substrate, generally for about 1 to 3 minutes, in an alkaline developer solution based on potassium hydroxide, sodium hydrogen phosphate, sodium metasilicate, sodium hydroxide and mixtures thereof.

If a negative photoresist is desired, the photoresist layer, is baked, after image-wise exposure and before development for about 10 to about 20 minutes at about 110°–130° C. After this thermal treatment, the photoresist layer is blanket exposed (i.e. without a mask) to a source of ultraviolet radiation for about 60 to about 120 seconds and then developed in an alkaline developer solution to obtain the negative photoresist.

The present invention is illustrated in detail with reference to the Examples, but the invention is not limited to the details of the Examples.

EXAMPLE I

A photoresist composition was prepared by dissolving 17 percent by weight PI 2566, a polyamic acid having a molecular weight of 20,000 in a solvent mixture comprised of 50 percent by weight N-methyl-2-pyrrolidone (NMP) and 50 % by weight 2-ethoxyethanol.

A diazoquinone photosensitizer 2,3,4-tri[(6-diazo-5,6-dihydro -5- oxo-napthalenyl) sulfonyl-oxy]-benzokenone was incorporated in the polyamic acid solution at a concentration of 14% by weight. The solution diluted in a 50/50 NMP/ethoxyethanol solvent at a ratio of 2.5 parts polyamic acid solution prepared above to 1 part solvent was applied to the surface of a silicon wafer having a thermally generated silicon dioxide layer which had been treated with an aminopropyltriethoxy silane adhesion promoted by means of a spin coating process with 5000 revolutions/min. The photoresist coated wafer was prebaked for 25 minutes at 95° C. to partially imidize the polyamide acid to a level of 20% imidization. The partially imidized photoresist layer having a thickness of 2 um was image-wise exposed through a pattern mask to a source of actinic radiation for 60 seconds with a source having a power of 300 watts over a wavelength of 365 nanometers for 60 seconds.

The exposed positive photoresist film was developed in a 0.23N KOH developer solution. A development time of about 150 seconds was required to resolve 4 um line and space geometries with good edge definition on the photoresist film.

COMPARATIVE EXAMPLE

The procedure of Example I was repeated except that the PI 2566 polyamic acid was replaced by an equivalent amount of PI 5878. The photoresist composition was deposited upon a series of silicon wafers and the coated wafers were prebaked at temperatures of 75, 85 and 95° C. for periods extending from 20 minutes to 1 hour. Development of each of these resists showed essentially no variation in the development times demonstrating that no reduction in acidity occurred.

IR examination of one composition baked at 80° C. for 1 hour confirmed that no imidization of the PI 5878 had occurred due to the baking process.

EXAMPLE II

The procedure of Example I was repeated with the exception that the concentration of the diazoquinone photosensitizer was 10% by weight and no dilution of the polyamic acid solution was made prior to spin coating at 3000 revolutions/min.

The exposed positive photoresist film was developed in 0.40 N KOH developer solution. A development time of 80 seconds was required to obtain 50 um vias on 10um thick film with 45° side walls.

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

What is claimed is:

1. A composition comprising a mixture of a polyamic acid material of reduced acidity comprising a polyamic acid having the general formula

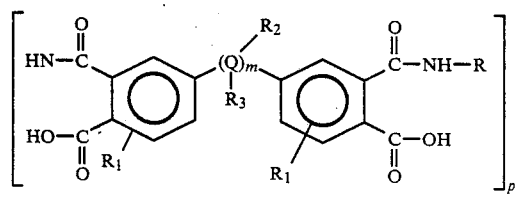

wherein Q is C or C=O, R is a divalent aromatic or aliphatic radical having no active hydrogen, $R_1$ is a hydrogen or an alkyl group containing 1 to 3 carbon atoms, and $R_2$ and $R_3$ are independently selected from H, $CH_3$, $C_nH_{2n+1}$ where n is a positive integer, and $CF_3$, m is an integer from 0 to 1 and p is a positive integer, which is reacted or blended to form (a) a polyamic acid material having a level of acidity which is reduced by from about 10 to about 40 percent of the original polyamic acid and (b) a diazoquinone photosensitizer, each of (a) and (b) being present in sufficient quantity to form a photoresist composition which after radiation exposure and development in alkaline solution, produces a resist image of fine line resolution.

2. The composition of claim 1 wherein, before having its acidity reduced, the polyamic acid has the formula

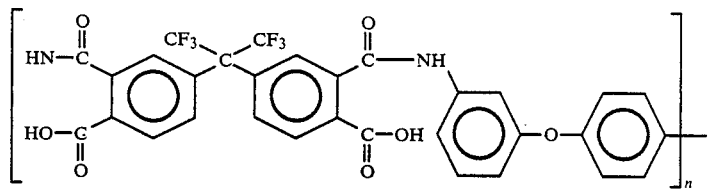

3. The composition of claim 1 wherein the polyamic acid is partially imidized to an imidization level of from about 20 to about 40 percent.

4. The composition of claim 1 wherein the polyamic acid of reduced material comprises a carboxylate amine salt formed by the reaction product of a polyamic acid and a basic organic compound.

5. The composition of claim 1 wherein the polyamic acid of reduced acidity a polyamic acid wherein a portion of the free carboxylic acid groups of the polyamic acid have been neutralized by reaction with an organic base.

6. The composition of claim 5 wherein the organic base is triethylamine.

7. The composition of claim 1 wherein the polyamic acid material is selected from the group consisting of a polyamic acid with (a) an ester derivative thereof, (b) a copolymer of the polyamic acid and an ester derivative thereof and (c) mixtures thereof.

8. The composition of claim 1 wherein the diazoquinone photosensitizer is 2,3,4-tri[(6-diazo -5,6-dihydro-5-oxo-napthalenyl) sulfonyl-oxy]-benzophenone.

9. The composition of claim 1 wherein the diazoquinone photosensitizer is 4,8 bis [(6-diazo -5,6-dihydro-5-oxo-1-naphthalenyl) sulfonyl-oxy methyl]tricyclo [5.2.1.0$^{2,6}$]decane.

10. The composition of claim 1 wherein the diazoquinone sensitizer is incorporated in the photoresist composition at a concentration of about 5 to about 25 percent by weight.

* * * * *

UNITED STATES PATENT AND TRADEMARK OFFICE
CERTIFICATE OF CORRECTION

PATENT NO. : 4,880,722

DATED : November 14, 1989

INVENTOR(S) : Moreau et al.

It is certified that error appears in the above—identified patent and that said Letters Patent is hereby corrected as shown below:

On the title page: The inventors should read:

Wayne M. Moreau, Wappingers Falls;

Kaolin N. Chiong, Pleasantville;

Ming-Fea Chow, Poughquagh, and

Nancy Ward Snyder, Newburg, all of New York

Claim 2, col. 8, line 45, the illustrated structure should read:

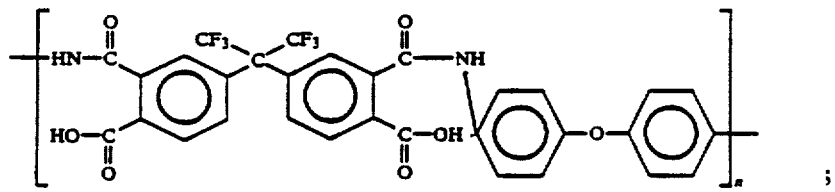

Claim 4, col. 8, line 57, delete "of reduced";

UNITED STATES PATENT AND TRADEMARK OFFICE
CERTIFICATE OF CORRECTION

PATENT NO. : 4,880,722

DATED : November 14, 1989

INVENTOR(S) : Moreau, et al

It is certified that error appears in the above-identified patent and that said Letters Patent is hereby corrected as shown below:

Claim 5, col. 8, line 61, replace "of reduced activity" with --material comprises--.

Signed and Sealed this

Twenty-third Day of October, 1990

*Attest:*

HARRY F. MANBECK, JR.

*Attesting Officer*  *Commissioner of Patents and Trademarks*